United States Patent [19]

Niciolo et al.

[11] Patent Number: 5,088,931

[45] Date of Patent: Feb. 18, 1992

[54] APPARATUS FOR SEQUENCING SIGNALS IN CONJUNCTION WITH SHORTING CONTACTS

[75] Inventors: Lawrence J. Niciolo; James A. Thompson, both of Red Bank, N.J.

[73] Assignee: AT&T Bell Laboratories, Murray Hill, N.J.

[21] Appl. No.: 642,248

[22] Filed: Dec. 24, 1990

[51] Int. Cl.⁵ .................... H01R 23/70; H01R 33/96
[52] U.S. Cl. ................................. 439/188; 439/924
[58] Field of Search ............... 439/59, 60, 188, 924; 200/51.1

[56] References Cited

U.S. PATENT DOCUMENTS

| | | | |
|---|---|---|---|
| 3,138,675 | 6/1964 | Krone | 200/51.1 |
| 3,432,795 | 3/1969 | Jayne | 439/924 |
| 3,973,817 | 8/1976 | Stalley et al. | 439/924 |
| 3,993,935 | 11/1976 | Phillips et al. | 439/924 |
| 4,070,557 | 1/1978 | Ostapovich | 439/188 |
| 4,106,841 | 8/1978 | Vladic | 439/188 |
| 4,510,553 | 4/1985 | Faultersack | 361/413 |
| 4,549,036 | 10/1985 | Reichbach | 439/924 |
| 4,849,944 | 7/1989 | Matsushita | 439/60 |
| 4,952,758 | 8/1990 | Dara | 439/188 |

FOREIGN PATENT DOCUMENTS

1197299 7/1970 United Kingdom .............. 200/51.1

*Primary Examiner*—Neil Abrams
*Attorney, Agent, or Firm*—Thomas Stafford

[57] ABSTRACT

Apparatus is disclosed for use when a first connector is to be mated to a second connector that includes shorting contacts and is being supplied with a plurality of active signals such that the breaking of the electrical connection between the shorting contacts themselves is substantially delayed until the time of making of the electrical connection between the shorting contacts and at least one corresponding conductive terminal of the first connector. Such a delay permits electrical separation of the shorting contacts only at the instant when at least one of the shorting contacts will begin to contact its corresponding conductive terminal without substantially impairing any other characteristics of the connector. This delay is established by employing a first connector which reduces or eliminates altogether any insulating material that passes between the shorting contacts as the first connector is inserted into the second connector prior to the shorting contacts establishing electrical conductivity with at least one of their corresponding conductors.

13 Claims, 4 Drawing Sheets

APPARATUS FOR SEQUENCING SIGNALS IN CONJUNCTION WITH SHORTING CONTACTS

TECHNICAL FIELD

This invention relates to the sequencing of signals supplied to a connector as it is being interconnected to a corresponding connector and, more particularly, when such a corresponding connector contains shorting contacts.

BACKGROUND OF THE INVENTION

It is well known that electrical circuit packs require that signals be supplied to them at start-up in a predetermined sequence so as to prevent damage to the circuit pack as well as to obtain proper initialization. Such signals are typically supplied via interconnected connectors and include, but are not limited to, dynamic signals, e.g., time-varying control signals, clock signals and data signals, as well as static signals, e.g., operating potentials and time-fixed control signals. A sequencing mechanism that can control the application of signals to the circuit pack must be incorporated either directly into the interconnection apparatus itself or into a control mechanism external to the circuit pack. Control mechanisms, external to the interconnected connectors, cannot be employed when a connector of a circuit pack is to be plugged into an already active connector, i.e., a connector that is already receiving the signals for transmission to the circuit pack. Such active connectors are typically employed in protection switching arrangements in which a failed circuit pack has been bypassed and must be replaced without shutting down the entire system to which the active connector is connected.

A prior mechanism for sequencing the signals applied to a circuit pack that is not external to either connector and can be used with active connectors, employs conductive fingers of different lengths which form a first connector at an edge of the circuit pack known as an edge connector. The application of signals from the active connector to the circuit pack occurs as the edge connector of the circuit pack is inserted into the active connector. Each signal supplied from the active connector to the circuit pack is applied to the edge connector in accordance with a desired predetermined order that is dependent upon the lengths of the various conductive fingers of the edge connector that transport input signals. Similarly, signals that are to be supplied from the circuit pack to the active connector are initially supplied from the edge connector in accordance with a desired predetermined order that is dependent upon the lengths of the various conductive fingers of the edge connector transporting output signals. Other prior sequencing methods that employ conductive pins, typically capitalize upon predetermined variations in the lengths of the pins whereby the interconnection of signals from between the first and second connectors is controlled.

Some prior protection switching arrangements also require that certain signals pass continuously through the active socket from the input point of the signal to the output point of the signal with permissible interruptions of only a short and fixed duration if the signal is not being processed. To maintain a continuous signal flow, an input point and an output point for such a signal are located opposite each other in the connector and spring action shorting contacts are employed as the contacts in the active connector. When the active connector is not interconnected to another connector, the shorting contacts are forced closed, thereby touching each other and creating an electrical connection between them, i.e., a short circuit connection. A signal supplied to a first one of the contacts of the shorting contacts, designated the input contact, flows directly, when the shorting contacts are closed, to the opposing one of the shorting contacts, designated the output contact. Upon insertion of another connector, e.g., one connected to a circuit pack, into the active connector the shorting contacts are forced apart. Each contact of the shorting contacts can contact independent conductive terminals of the connector to which the active connector is mated. Thereafter, any desired processing of the signal supplied to the circuit pack from the input contact of the shorting contacts can be performed by the circuit pack. The resulting processed signal may be supplied as an output to the output contact of the shorting contacts via the opposing conductive terminal, and/or it may be supplied to any other individual or combination of conductive contacts in the active connector by the opposing conductive terminals, dependent on the implementor's discretion. Alternatively, no processing of the input signal can be performed, e.g., a direct connection can be established between the conductive terminal of the connector of the circuit pack receiving the signal as an input from the input contact of the shorting contacts and the corresponding conductive terminal of the connector supplying a signal as an output to the output contact of the shorting contacts via a relay in the event of circuit pack failure. Such a configuration is typically employed in protection switching.

Interruptions in the supply of signal from the input contact to the output contact of the shorting contacts typically take place upon mating or disconnection of a first connector into an active connector because the time of "make", i.e. the time at which a good electrical connection is made between the conductive terminal of interest on the first connector and the active connector, is later than the time of "break", i.e. the time at which the electrical connection is broken between the shorting contacts. Such a time differential is largely caused by the interposition of an insulating material inherent in the first connector itself which causes the shorting contacts to open prior to their reaching the first point on the first connector to which the conductive material comprising the terminal element reaches. This early opening of the shorting contacts is an undesired side effect of having the terminal elements which are to make contact with the shorting contacts be of a shorter length than some of the other terminal elements while retaining the presence of the insulating portion of the connector material so as to also achieve other desirable goals. Such goals include, without limitation: ease of manufacture, reduced manufacturing costs, enhanced mechanical reliability and ability to use with some insertion force reduction techniques. Additionally, such a connector, upon mating with or disconnecting from the active connector, can be placed so that the shorting contacts remain open and no contact is established between the shorting contacts and the conductive terminal element of the first connector.

Another problem arising from the use of shorting contacts and predetermined variable length conductors with edge connectors so as to achieve sequencing is a limitation of some of the commercially available connectors and circuit packs to only three guaranteed levels of sequencing, i.e., a maximum of three conductive finger lengths can be distinguished. Additionally, it is economically desirable to keep the number of available sequencing levels to a minimum so as to employ less precise tolerances and minimize the overall size of the interconnection apparatus. As mentioned, many typical applications require relays configured so as to allow a signal of interest to bypass the circuit pack in the event of failure of the circuit pack. A typical sequencing assignment is for the first level of signals, i.e., those signals carried by the longest conductive fingers, to be assigned to ground potential. The second level, i.e., those signals carried by the next longest conductive fingers, are assigned to power, typically +5 volts, and the signal controlling the state of the relay (relay arbitration). The third level, i.e., those signals carried by the shortest conductive fingers, are assigned to all other signals, including the signal of interest which passes through the shorting contacts and the contacts of the relay.

The relay is opened and closed under the control of a relay driver circuit which is responsive to the aforementioned signal controlling the relay arbitration. The input lead for receiving the signal controlling the relay arbitration is diode clamp protected against damage by excessive voltage transients. However, if the input lead is diode clamped to the power lead, a race condition occurs (dependent on the angle of board insertion, trace layout and the electrical characteristics of the power and relay arbitration control signal) whereby if the relay control signal wins the clamping diode begins to conduct. This causes the signal controlling the relay arbitration to appear at the power bus of the circuit pack. The circuit pack then attempts to power its circuitry from the power bus by drawing, in turn, large amounts of power through the relay control signal lead. The drawing of such amounts of power can damage the supplier and/or receiver of the signal controlling the relay arbitration and the relay driver circuit.

SUMMARY OF THE INVENTION

The difficulties with prior connector based sequencing arrangements employed when a first connector is to be mated to a second connector including shorting contacts and being supplied with a plurality of active signals are overcome, in accordance with an aspect of the invention, by delaying the breaking of the electrical connection between the shorting contacts themselves substantially until the time of making of the electrical connection between the shorting contacts and at least one corresponding conductive terminal of the first connector. Such a delay permits electrical separation of the shorting contacts only at the instant when at least one of the shorting contacts will begin to contact its corresponding conductive terminal without substantially impairing any other characteristics of the connector. This delay is established by employing a first connector which reduces or eliminates altogether any insulating material that passes between the shorting contacts as the first connector is inserted into the second connector prior to the shorting contacts establishing electrical conductivity with at least one of their corresponding conductors. In one embodiment, such a delay is established by cutting a notch in the insulating circuit board of a circuit pack from the edge of the circuit board closest to the conductive finger which is to first interconnect with at least one contact of the shorting contacts substantially until the beginning of the conductive material comprising the finger. Additionally, in accordance with another aspect of the invention, by removing any possibility of any conductive paths between the input lead receiving the relay arbitration and the powering potential, by design or judicious selection of the relay driver circuit, the problematic race condition and the ensuing potential for component damage is eliminated.

BRIEF DESCRIPTION OF THE DRAWING

In the Drawing.

Shown in FIG. 1 is an exemplary prior art edge connector of a circuit pack.

Shown in FIG. 4 is an exemplary edge connector of circuit pack embodying aspects of the invention.

Shown in FIG. 6 is the final interconnection of a socket and a circuit pack embodying aspects of the invention.

DETAILED DESCRIPTION

Figure 1:
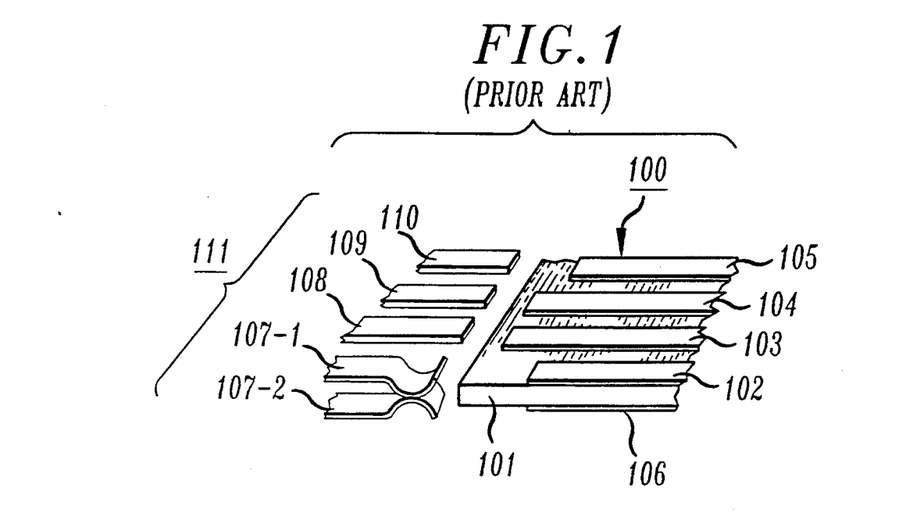
Figure 2:
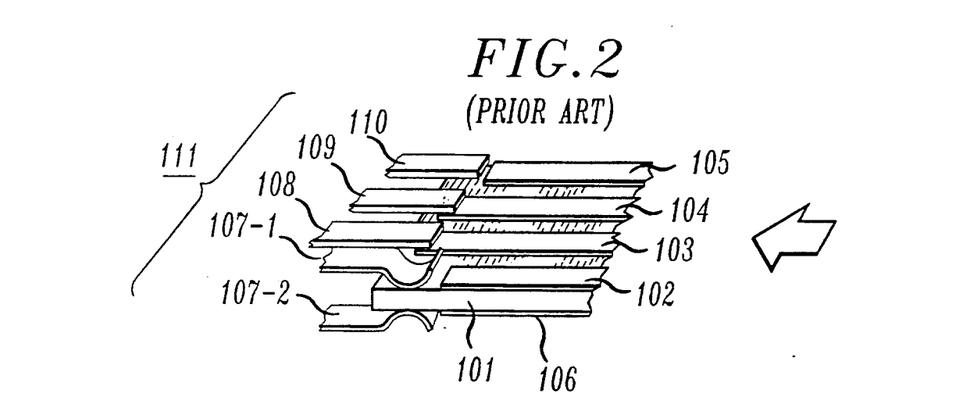
FIG. 2 illustrates a prior art circuit pack and socket in the initial stages of interconnection.
Figure 3:
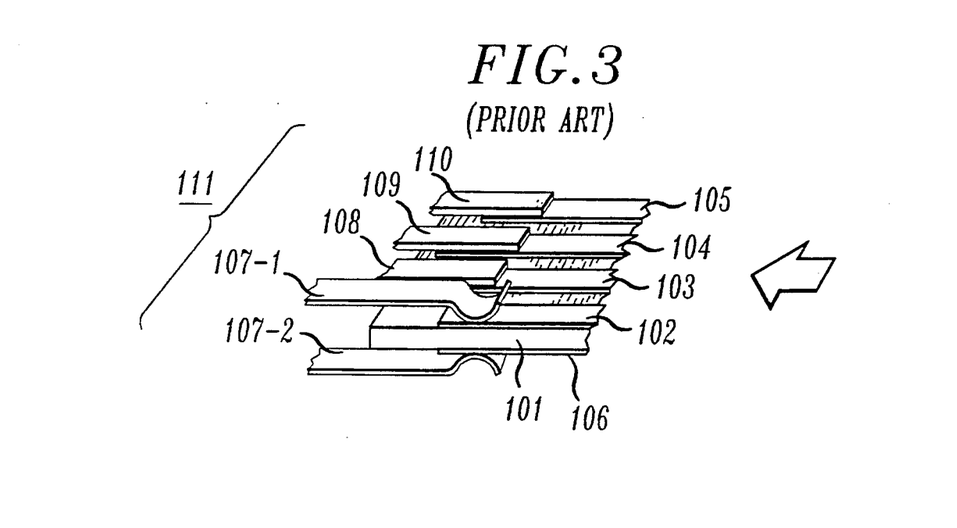
FIG. 3 depicts the final interconnection of a prior art circuit pack and a socket.

FIGS. 1 through 3 comprise a sequence depicting an exemplary interconnection of an edge connector formed by a portion of a circuit pack to a connector containing a pair of shorting contacts in accordance with the prior art. Shown in FIG. 1 is an exemplary edge connector of prior art circuit pack 100 comprised of circuit board 101, upper conductive fingers 102, 103, 104, and 105 and lower conductive finger 106. Also shown are shorting contacts 107 comprised of upper shorting contact 107-1 and lower shorting contact 107-2 and contacts 108, 109 and 110 which are part of exemplary socket 111 (the outer body of which is not shown for clarity purposes due to the cutaway nature of the figure.) Shorting contacts 107 are spring loaded (spring mechanism not shown for clarity purposes) so that upper shorting contact 107-1 and lower shorting contact 107-2 are pressed together and make an electrical connection unless prevented from doing so by the imposition of a force or insertion of some insulating material to separate them.

Conductive fingers 103 and 104 are longer than conductive fingers 102, 105 and 106. This is for sequencing purposes so that conductive fingers 103 and 104 make contact with their corresponding contacts, contacts 108 and 109, prior to conductive fingers 102, 105 and 106 make contact with their corresponding contacts, shorting contact 107-1, contact 110 and shorting contact 107-2 respectively. In this example, contacts 108 and 109 carry power and ground, respectively. These power and ground signals must be supplied to prior art circuit pack 100 via conductive fingers 103 and 104 prior to any of the signals carried by shorting contact 107-1, contact 110 and shorting contact 107-2. Edge 111 of circuit pack 100 formed from the insulating material of circuit board 101 extends beyond the conductive fingers 102 through 105.

In FIG. 1 prior art circuit pack 100 and socket 111 have not achieved any degree of interconnection at all. Shorting contacts 107 are initially in the closed position and both shorting contact 107-1 and shorting contact 107-2 carry the same signal as they are short circuited together. For purposes of this example the signal arrives on shorting contact 107-1 and exits via shorting contact 107-2.

FIG. 2 illustrates prior art circuit pack 100 and socket 111 in the initial stages of interconnection. The arrow depicts the direction of relative motion of prior art circuit pack 100 with respect to socket 111 as they are brought into contact. At the time instant shown, electrical connection between contacts 108 and 109 and conductive fingers 103 and 104 has already been established by their overlapping. Also, electrical connection has not been established between conductive fingers 102, 105 and 106 and, respectively, shorting contact 107-1, contact 110 and shorting contact 107-2. Thus, the desired sequencing effect is obtained. However, shorting contacts 107 are in the open position and the signal arriving on shorting contact 107-1 is blocked from reaching shorting contact 107-2 by the insulating action of the interposition of circuit board 101 between shorting contact 107-1 and shorting contact 107-2. Should the relative motion between prior art circuit pack 100 and socket 111 cease at this time, as is possible, shorting contacts 107 will remain perpetually open. This state is unsatisfactory and results from the desirableness of having an insulating portion prior to the conductive fingers so as to help reduce the insertion force and/or avoid unnecessary pressure on the conductive fingers which could tend to lift them off of the circuit board.

Shown in FIG. 3 is the final interconnection of prior art circuit pack 100 and socket 111 which results if the relative motion of prior art circuit pack 100 with respect to socket 111 is maintained until prior art circuit pack 100 can advance no further. Electrical connections between contacts 108 and 109 and conductive fingers 103 and 104 as well as between conductive fingers 102, 105 and 106 and, respectively, shorting contact 107-1, contact 110 and shorting contact 107-2 are established. The signal supplied from shorting contact 107-1 is transmitted to conductive finger 102, processed by prior art circuit pack 100 and the resulting output is supplied via conductive finger 106 to shorting contact 107-2.

Figure 4:
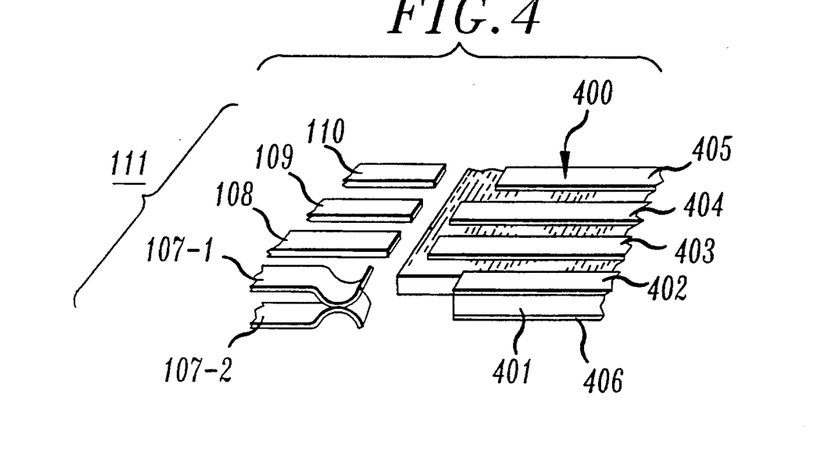

FIGS. 4 through 7 comprise a sequence depicting an exemplary interconnection of a portion of a circuit pack to a socket containing a pair of shorting contacts in accordance with aspects of the invention. Shown in FIG. 4 is an exemplary edge connector of circuit pack 400 embodying aspects of the invention, comprised of circuit board 401, upper conductive fingers 402, 403, 404, and 405 and lower conductive finger 406. Circuit board 401 and conductive fingers 402, 403, 404, 405 and 406 correspond in functionality to circuit board 101 and conductive fingers 102, 103, 104, 105 and 106 respectively, of FIGS. 1 through 3. Note that, in accordance with an aspect of the invention, a notch has been cut from the edge of circuit board 401 until the point at which the conductive material comprising the edgemost reaching point of conductive fingers 402 and 406 begins. Such a notch may be cut for any conductive fingers that are to establish electrical connectivity with shorting contacts. Note that the notch should be cut so that the shorting contacts maintain electrical connection with each other while they are within the boundaries of the notch. Typically this is achieved by having the width of the shorting contacts approximately equal the width of the corresponding conductive finger(s upper and lower) and the notch width just slightly larger. However, no limitation on the width of the notch is to be construed. The notch acts as a delay that postpones the time of separation of the shorting contacts until at least one of the shorting contacts is to contact at least one of the corresponding conductive fingers. Alternative designs for the shorting contacts may necessitate other widths be employed without limiting the scope of the invention. Several notches may be cut at different locations and of different lengths and/or widths because the signals being sequenced are expected to become available at different times. The notch may be cut into pre-existing circuit packs after completion or it may be fabricated into the circuit pack during manufacture without limitation on the time or method of cutting the notch. Also, no limitation is intended to be construed from the depicted example which places the notch and conductive fingers at the apparent corner of circuit board 401. This placement was chosen for clarity of exposition purposes only.

Shown also are shorting contacts 107 comprised of upper shorting contact 107-1 and lower shorting contact 107-2 and contacts 108, 109 and 110 which are a part of socket 111. Again shorting contacts 107 are spring loaded (not shown) so that upper shorting contact 107-1 and lower shorting contact 107-2 are pressed together and make an electrical connection.

Conductive fingers 403 and 404 are longer than conductive fingers 402, 405 and 406. Again, this is for sequencing purposes, so that conductive fingers 403 and 404 make contact with their corresponding contacts, contacts 108 and 109, prior to conductive fingers 402, 405 and 406 make contact with their corresponding contacts, shorting contact 107-1, contact 110 and shorting contact 107-2 respectively. In this example, contacts 108 and 109 carry power and ground, respectively, and these must be supplied to the circuit pack 400 via conductive fingers 403 and 404 prior to any of the signals carried by shorting contact 107-1, contact 110 and shorting contact 107-2.

In FIG. 4 circuit pack 400 and socket 111 have not been brought together at all. Shorting contacts 107 are in the closed position and both shorting contact 107-1 and shorting contact 107-2 carry the same signal as they are shorted together. For purposes of this example upper shorting contact 107-1 is defined to be the input contact of shorting contacts 107 and lower shorting contact 107-2 is defined to be the output contact of shorting contacts 107. Thus, the signal of interest is received by circuit pack 400 on conductive finger 402 from shorting contact 107-1 and is supplied as output from conductive finger 406 to shorting contact 107-2.

Figure 5:
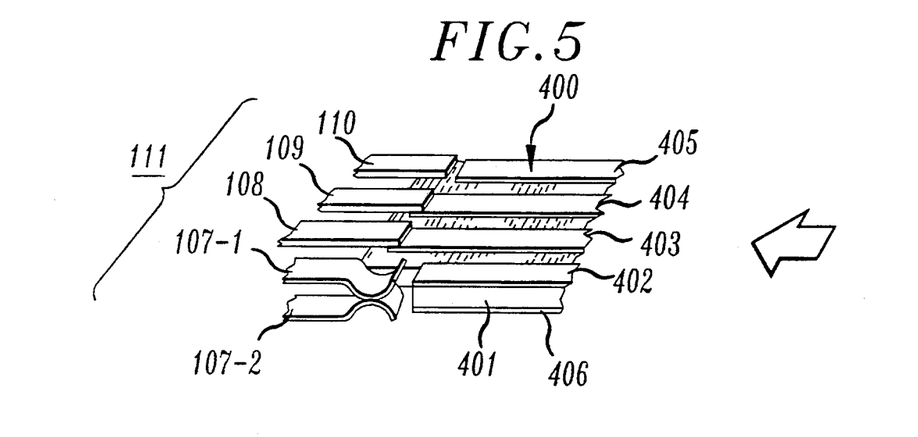
FIG. 5 depicts a circuit pack embodying aspects of the invention and a socket in the initial stages of interconnection.

FIG. 5 illustrates circuit pack 400 and socket 111 in the initial stages of interconnection. The arrow depicts the direction of relative motion of circuit pack 400 with respect to socket 111 as they are brought into contact. Electrical connection between contacts 108 and 109 and conductive fingers 403 and 404 has already been established by their overlapping. However, electrical connection has not been established between conductive fingers 402, 405 and 406 and, respectively, shorting contact 107-1, contact 110 and shorting contact 107-2. Thus, the desired sequencing effect is obtained.

Additionally, in accordance with an aspect of the invention, shorting contacts 107 remain in the closed position because they are able to occupy the space no longer occupied by circuit board 401 due to the presence of the notch. The breaking of electrical interconnection between the shorting contacts is thus delayed until a later instant in time than the initial interconnection. The signal arriving on shorting contact 107-1 continues to reach shorting contact 107-2 and any insulating action of the interposition circuit board 401 between shorting contact 107-1 and shorting contact 107-2 present in the prior art has been eliminated. Should the relative motion between circuit pack 400 and socket 111 cease at this time, as is possible, shorting contacts 107 will remain perpetually closed and the signal arriving on shorting contact 107-1 will continue to reach shorting contact 107-2. This is an acceptable state even though it is not the state ultimately desired.

Should circuit pack 400 be inserted such that shorting contacts 107 are just open and yet are not quite contacting conductive fingers 402 and 406 a break in the signal arriving on shorting contact 107-1 to shorting contact 107-2 will result. However, the duration of this break will be small. Additionally, it is extremely difficult to stop the motion of circuit pack 400 precisely within the spatial window required to achieve such a state. Further, the nature of modern circuit pack insertion and removal mechanisms mitigate against the occurrence of a prolonged break. Also, the design of socket 111 is such that it typically provides an initial counterforce to the insertion force which tends to fade once initial penetration has been achieved thereby minimizing the period over which such a condition can exist.

One advantage of the invention is that it allows the insulating material of the circuit board to precede all the fingers of the circuit pack except those of the shorting contacts without causing the shorting contacts to be electrically disconnected for an unacceptable period of time. This allows the designers to employ configurations for reducing the insertion force of the circuit pack as well as configurations that reduce the force against the conductive fingers.

Figure 6:
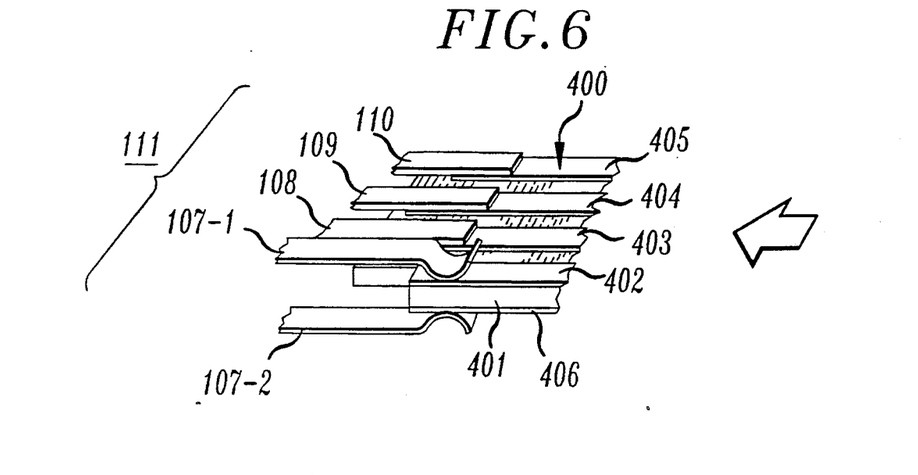

Shown in FIG. 6 is the final interconnection of circuit pack 400 and socket 111 which results if the relative motion of circuit pack 400 with respect to socket 111 is maintained until circuit pack 400 can advance no further. Electrical connection between contacts 108 and 109 and conductive fingers 403 and 404 as well as between conductive fingers 402, 405 and 406 and, respectively, shorting contact 107-1, contact 110 and shorting contact 107-2 is established. The signal supplied from shorting contact 107-1 is transmitted to conductive finger 402, processed by circuit pack 400 and the resulting output is supplied via conductive finger 406 to shorting contact 107-2.

In the reverse direction, when disconnecting the circuit pack from socket 111, the time between the breaking of the electrical connection between the shorting contacts and corresponding conductive fingers of a circuit pack and the time of making of the electrical connection between the shorting contacts themselves is minimized. The sequence of events is reversed as the board goes from the state of connection shown in FIG. 6 to that shown in FIG. 5 and subsequently to that shown in FIG. 4.

Figure 7:
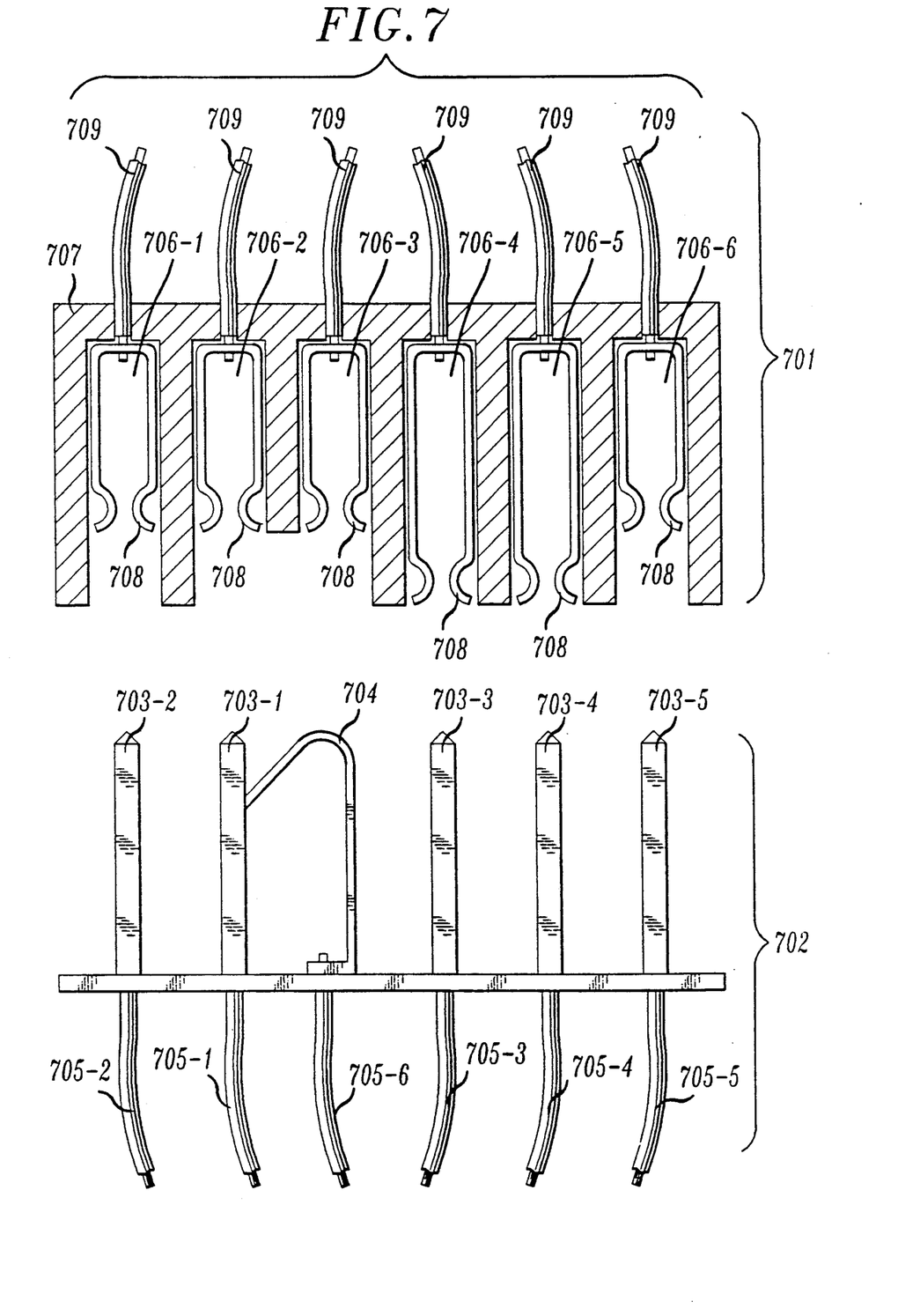
FIG. 7 depicts an exemplary implementation of aspects of the invention for use with connection apparatus employing conductive pins; and Shown in FIG. 8, in accordance with an aspect of the invention, is an exemplary relay driving circuit that avoids the potentially destructive race condition engendered by the prior art.

Shown in FIG. 7 is an exemplary implementation of aspects of the invention for use with connection apparatus employing conductive pins. As shown, female connector 701 is to be connected to male connector 702 which includes a pair of shorting contacts, comprised of pin 703-1 and contact 704, and pins 703-2 through 703-5. Conductive pins 703-1 through 703-5 are all the same height and are connected, respectively, to wires 705-1 through 705-6 for conducting signals.

Female connector 701 is comprised of cavities 706-1 through 706-6 which are fashioned from insulating material 707. Each of cavities 706 are coated with or contains within conductive material 708 to a predetermined height so as to constitute an individual socket capable of at least conductively interconnecting with its opposing member of male connector 702, either one of conductive pins 703 or contact 704. Basic male and female connectors employing pins and sockets are well known.

As shown in this example, conductive material 708 is formed into connective clips of different heights within cavities 706. The relative heights of conductive material 708 within each of cavities 706 effects the desired sequencing by establishing the electrical connection point for each cavity with its corresponding one of conductive pins 703 or contact 704 of the shorting contacts as male connector 702 is mated with female connector 701. The higher the conductive material in each of cavities 706 the earlier the conductive interconnection time in the sequence.

In accordance with an aspect of the invention, for the ones of cavities 706 corresponding to the shorting contacts, in this example cavities 706-2 and 706-3, a notch is cut into or an indentation is fabricated into insulating material 707 which separates the cavities. The notch or indentation is cut from the edge into which the corresponding pin or contact is to be inserted to the level at which the conductor contained within each cavity begins. The notch creates a delay that postpones the time of electrical separation of the shorting contacts until at least one of the shorting contacts is imminently ready to contact the conductive material in at least one of the sockets. Conductive material 708 from each socket is connected to conductors 709 for either supplying signals or receiving signals as required by the implementor. No limitations on the scope of the invention are intended or implied from the example configuration of socket and pins shown. An advantage of the invention is that the shorting contacts comprised of pin 703-1 and contact 704 remain in interconnected to each other until they are ready to make contact with conductive material 708 in their respective corresponding cavities without sacrificing any other desirable properties of connectors 701 and 702.

Figure 8:
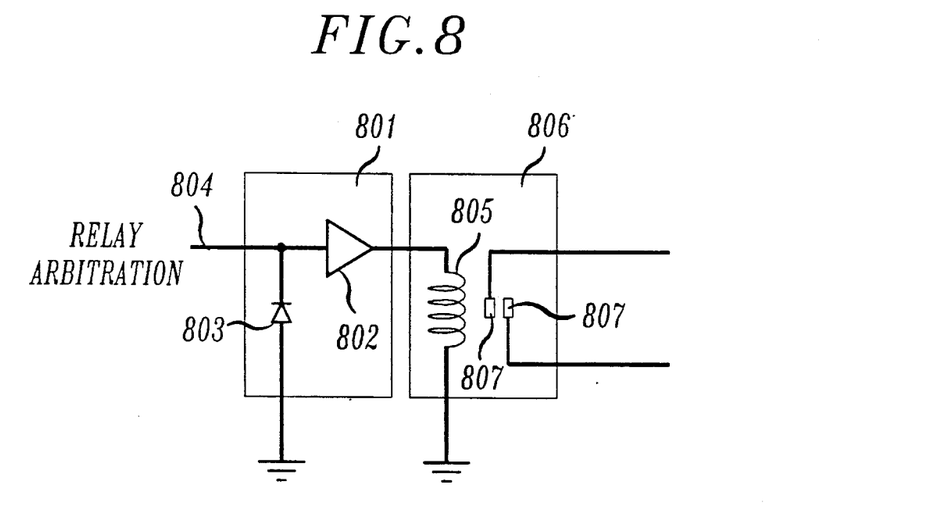

Shown in FIG. 8, in accordance with an aspect of the invention, is an exemplary relay driving circuit that avoids the potentially destructive race condition engendered by the prior art. The relay and driving circuit are part of the circuitry contained on a circuit pack, e.g., circuit pack 400 (FIG. 4). No potential conductive paths exist between the input signal lead receiving the relay arbitration and the power supply potential, in accordance with an aspect of the invention.

In the embodiment depicted in FIG. 8, an input signal lead receiving the relay arbitration signal is diode clamped to ground, by design or judicious selection of the relay driver circuit, thereby preventing the race condition and the ensuing component damage in prior art systems. As shown, relay driver chip 801 comprised of buffer driver 802 and clamping diode 803 is responsive to relay arbitration signal 804 to energize coil 805 of relay 806 thereby closing contacts 807. Such relay driver chips are commercially available. The signal carried though contacts 807 is that signal of interest supplied as input to circuit pack 400 (FIG. 4) from input contact 107-1 (FIG. 4) of shorting contacts 107.

A typical sequencing assignment is for the first level of signals, i.e., those signals carried by the longest conductive fingers, to be assigned to ground potential. The second level, i.e., those signals carried by the next longest conductive fingers, are assigned to power, typically +5 volts, and relay arbitration signal 804. The third level, i.e., those signals carried by the shortest conductive fingers, are assigned to all other signals, including the signal of interest which passes through contacts 807 of relay 806. Since, in accordance with an aspect of the invention, there is no conductive path from relay arbitration signal to the power potential, +5 volts as shown in this example, no race condition exists. An advantage of eliminating any conductive path from relay arbitration signal to the power potential is that only the three sequencing levels are required. If a conductive path did exist at least four sequencing levels would be required to avoid the race condition.

We claim:

1. A first connector of a first type adapted for electrical interconnection with a second connector of a second type opposite to said first type, said first connector having at least one edge, said second connector having a plurality of conductive contacts and at least one pair of shorting contacts, each contact of said shorting contacts electrically interconnected to its corresponding opposing contact while said contacts remain unseparated, said first connector comprising:
    a plurality of conductive terminal elements, each element having first and second ends, at least one of said ends of each element lying within a predetermined one of a plurality of parallel planes along said at least one edge of said first connector, said planes being arranged such that a predetermined sequence of interconnections between said conductive terminal elements and corresponding ones of said conductive contacts and said shorting contacts of said second connector occurs at predetermined time instants should said first and second connectors be interconnected and all of said planes recessed a predetermined non-zero distance from a further plane parallel to said planes that intercepts a point on said at least one edge that is closest to the edgemost one of said parallel planes;
    at least one of said plurality of conductive terminal elements adapted and intended for interconnection with at least one of said contacts of said shorting contacts and having said at least one end within a predetermined plane of said plurality of planes not nearest said edge; and
    at least one means for delaying said shorting contacts of said second connector from ceasing to electrically interconnect to each other as said first and second connectors are interconnected to each other substantially until at least one contact of said at least one pair of shorting contacts interconnects with at least one of said conductive terminal elements adapted and intended for interconnection with said at least one pair of shorting contacts,
said first connector being a male edge connector of a circuit pack formed from at least a portion of an insulating circuit board having mounted thereon said conductive terminal elements which are conductive fingers and said means for delaying is formed by said insulating circuit board having a notch of predetermined width cut therein from said edge of said first connector parallel to said planes of said first connector substantially until said plane in which said end of said at least one conductive terminal element intended for interconnection with at least one of said contacts of said shorting contacts lies.

2. The apparatus as defined in claim 1 wherein said notch is at least as wide as the width of said shorting contacts.

3. The apparatus as defined in claim 1 wherein a plurality of said notches are cut.

4. The apparatus as defined in claim 3 wherein said plurality of said notches are of different but predetermined lengths and widths.

5. The apparatus as defined in claim 4 wherein each of said plurality of said notches are of substantially identical lengths and widths.

6. The apparatus as defined in claim 1 wherein said first connector is mounted on a circuit pack and said circuit pack further includes at least one relay for bypassing said circuit pack by at least one signal supplied from said at least one shorting contacts without any processing being performed thereon, and an at least one diode having an anode and a cathode, said cathode being connected to an at least one terminal element of said first connector to which a signal is supplied from a conductive contact of said second connector for controlling said relay and said anode being connected to another terminal element of said first connector and supplied by a different conductive contact of said second conductor with a lower potential than said terminal element connected to said cathode, said diode for protecting circuit components connected to said cathode from damage.

7. A first connector of a first type adapted for electrical interconnection with a second connector of a second type opposite to said first type, said first connector having at least one edge, said second connector having a plurality of conductive contacts and at least one pair of shorting contacts, each contact of said shorting contacts electrically interconnected to its corresponding opposing contact while said contacts remain unseparated, said first connector comprising:
    a plurality of conductive terminal elements, each element having first and second ends, at least one of said ends of each element lying within a predetermined one of a plurality of parallel planes along said at least one edge of said first connector, said planes being arranged such that a predetermined sequence of interconnections between said conductive terminal elements and corresponding ones of said conductive contacts and said shorting contacts of said second connector occurs at predetermined time instants should said first and second connectors be interconnected;
    at least one of said plurality of conductive terminal elements adapted and intended for interconnection with at least one of said contacts of said shorting contacts and having said at least one end within a predetermined plane of said plurality of planes not nearest said edge; and
    at least one means for delaying said shorting contacts of said second connector from ceasing to electrically interconnect to each other as said first and second connectors are interconnected to each other substantially until at least one contact of said at least one pair of shorting contacts interconnects with at least one of said conductive terminal elements adapted and intended for interconnection with said at least one pair of shorting contacts said first connector being a female connector having at least a body formed of a non-conducting material and having a conductive material forming said conductive terminal elements contained within a plurality of sockets formed within said body and said means for delaying is formed by said non-conducting material forming said body having a notch cut therein.

8. The apparatus as defined in claim 7 wherein said non-conducting material of said body into which said notch is cut is a wall separating one socket from an adjacent socket of said female connector, at least one of said adjacent sockets being for interconnecting with at least one contact of said shorting contacts on said second connector and said notch being cut from said edge of said first connector substantially until said plane in which lies said end of said at least one conductive terminal element intended for interconnection with at least one of said contacts of said shorting contacts.

9. The apparatus as defined in claim 7 wherein said notch is at least as wide as the width of said shorting contacts.

10. The apparatus as defined in claim 7 wherein a plurality of said notches are cut.

11. The apparatus as defined in claim 10 wherein said plurality of said notches are of different but predetermined lengths and widths.

12. The apparatus as defined in claim 10 wherein each of said plurality of said notches are of substantially identical lengths and widths.

13. The apparatus as defined in claim 8 wherein said first connector is mounted on a circuit pack and said circuit pack further includes at least one relay for bypassing said circuit pack by at least one signal supplied from said at least one shorting contacts without any processing being performed thereon, and an at least one diode having an anode and a cathode, said cathode being connected to an at least one terminal element of said first connector to which a signal is supplied from a conductive contact of said second connector for controlling said relay and said anode being connected to another terminal element of said first connector and supplied by a different conductive contact of said second conductor with a lower potential than said terminal element connected to said cathode, said diode for protecting circuit components connected to said cathode from damage.

* * * * *